Oct. 10, 1950 A. F. BISCHOFF 2,525,442

RADIO SEARCH TUNING SYSTEM

Filed Dec. 31, 1947 2 Sheets-Sheet 1

Inventor:
Alfred F. Bischoff.
by Merton D. Moore
His Attorney.

Oct. 10, 1950 A. F. BISCHOFF 2,525,442

RADIO SEARCH TUNING SYSTEM

Filed Dec. 31, 1947 2 Sheets-Sheet 2

Inventor:
Alfred F. Bischoff,
by Merton D. Moore
His Attorney.

Patented Oct. 10, 1950

2,525,442

UNITED STATES PATENT OFFICE 2,525,442

RADIO SEARCH TUNING SYSTEM

Alfred F. Bischoff, Ballston Spa, N. Y., assignor to General Electric Company, a corporation of New York Application December 31, 1947, Serial No. 794,923

10 Claims. (Cl. 250—40)

This invention relates to automatic radio tuning systems and more particularly to a search tuning system for radio receivers by means of which the receiver is scanned through a band of frequencies and automatically tuned to a desired signal.

It is an object of this invention to provide a tuning system for radio receivers wherein the receiver circuits are tuned through a band of radio signals and caused to seek out a signal above a predetermined adjustable level and whereby the receiver is accurately tuned to the frequency of this signal.

It is a further object of this invention to provide a tuning system for radio receivers of the push button type which obviates the necessity of pretuned circuits are the use of mechanical means for tuning these receivers.

Yet another object of this invention is to provide a tuning system for a radio receiver wherein the receiver circuits are automatically tuned through a band of frequencies until a signal above a predetermined adjustable threshold is intercepted and wherein electronic means, actuated by the intercepted signal, are provided which accurately tune the receiver circuits to the frequency of this signal.

The features of my invention which I believe to be new are set forth with particularity in the appended claims. My invention itself, however, together with further objects and advantages thereof, may best be understood by reference to the following description when taken in conjunction with the accompanying drawings, in which Fig. 1 shows one embodiment of my search tuning system and Fig. 2 shows a preferred modification thereof.

Figure 1:
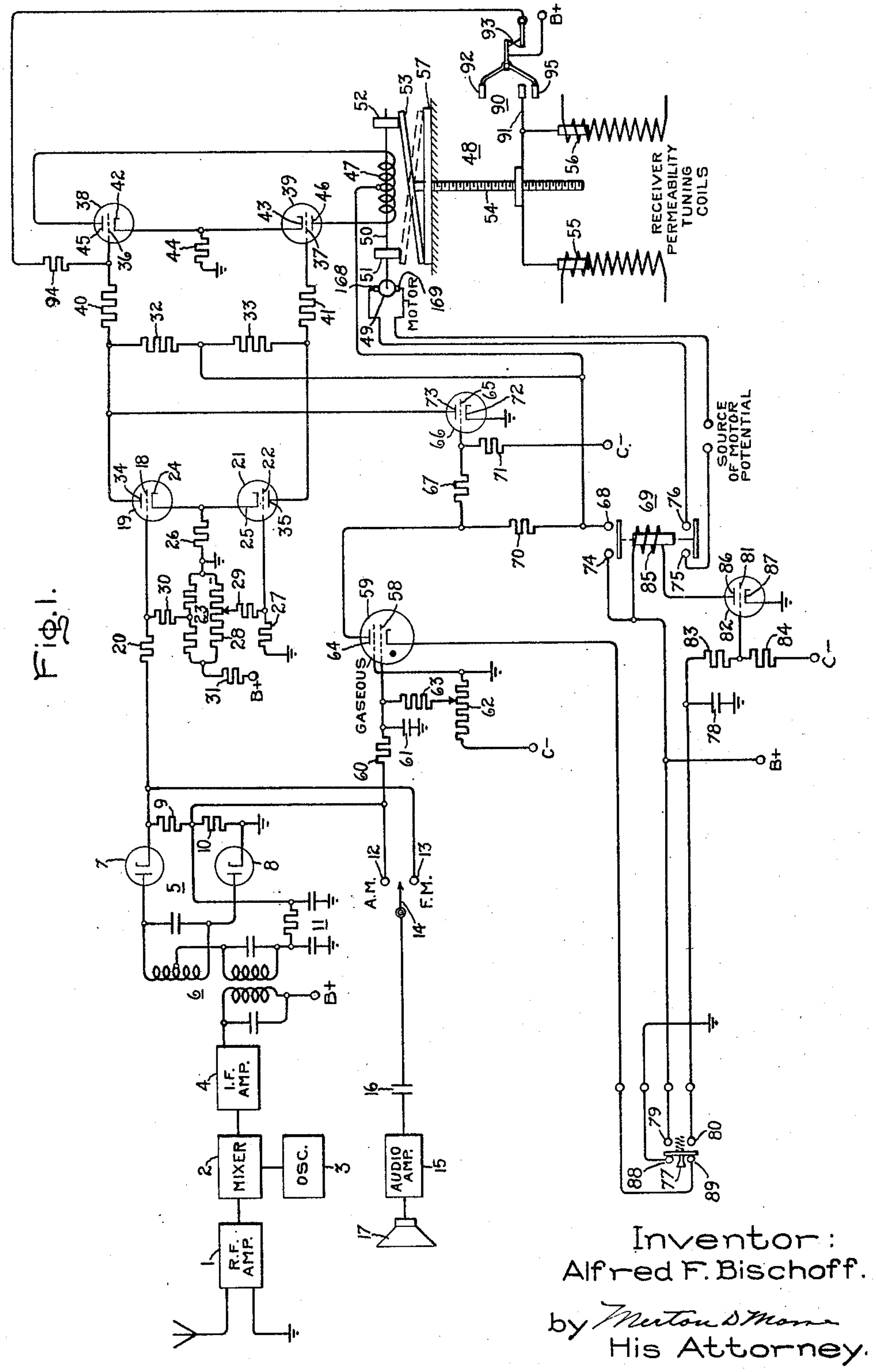
Figure 2:
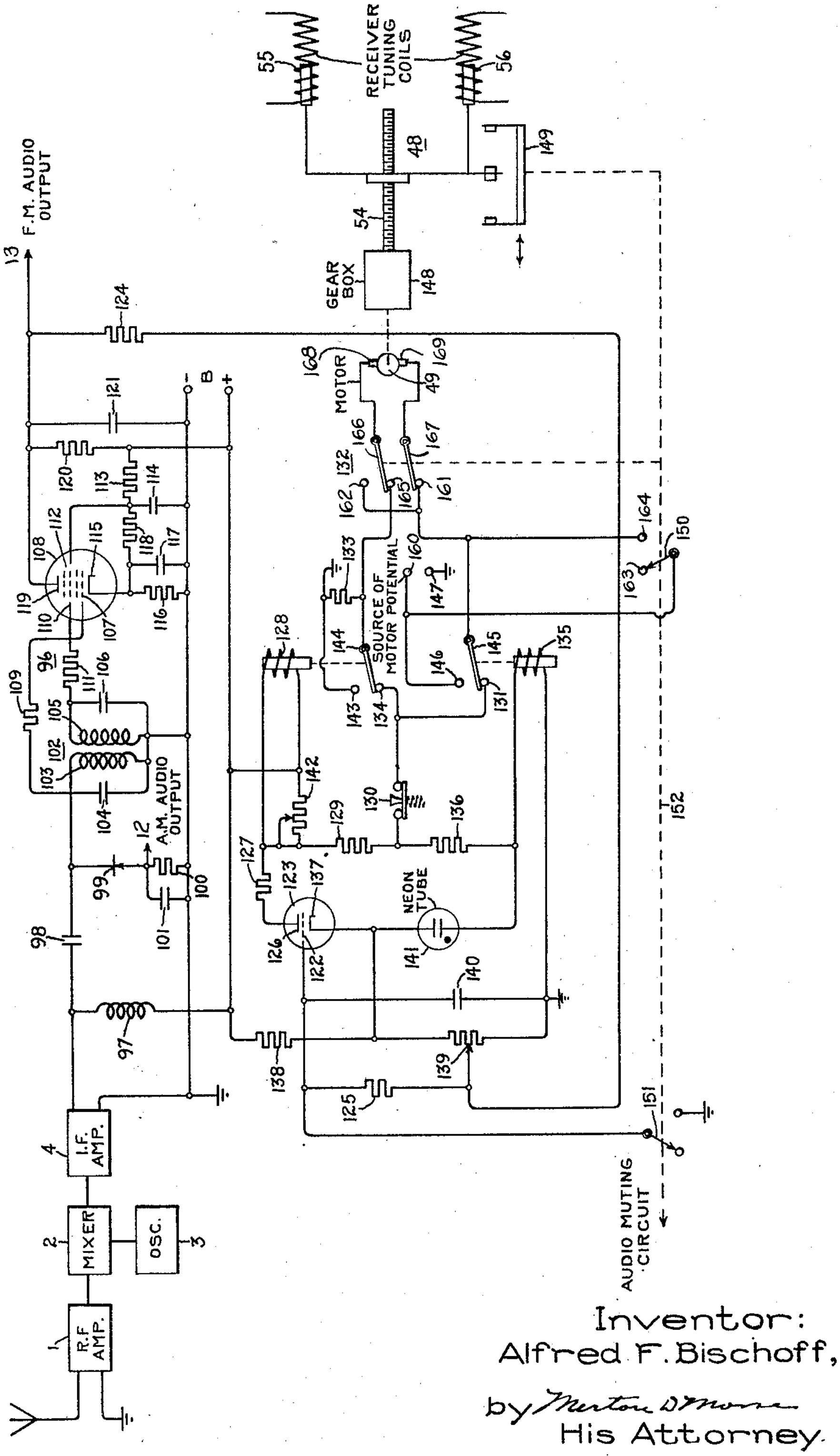

Referring now to Fig. 1, this figure shows a conventional superheterodyne receiver adapted to receive amplitude modulation and frequency modulation signals and further adapted to be tuned by the search tuning system which is embodied in the present invention.

The radio frequency amplifier stage of the receiver is designated as 1 and signals from this amplifier stage are heterodyned in a mixer stage 2 with oscillations from a local oscillator stage 3. The resulting intermediate frequency signals are amplified in one or more intermediate frequency amplifier stages 4. The output from the intermediate frequency amplifier stage 4 is applied to a conventional frequency discriminator 5. The discriminator comprises the usual frequency discriminator transformer 6, rectifying devices 7 and 8 and load resistors 9 and 10.

Amplitude modulation signals may be taken across the load resistor 10 and frequency modulation signals may be taken across the differentially connected load resistors 9 and 10, network 11 acting as a filter to remove any intermediate frequency components from the audio output. The amplitude modulation and frequency modulation outputs of the discriminator 5 are applied to the contacts 12 and 13 respectively of a switch 14 and in this manner amplitude modulation or frequency modulation signals may be supplied to an audio amplifier stage 15 through a capacitor 16 and thence to the usual translating device 17.

The output of the frequency discriminator 5 taken across the load resistors 9 and 10 is also applied to the control electrode 18 of a discharge device 19 through a resistor 20. The discharge device 19 is cathode coupled to a discharge device 21, the cathodes 24 and 25 of these devices being connected to ground through a resistor 26. These devices form a direct current amplifier stage, and are coupled in the well known manner so that the potential developed in the output of device 19 is of opposite polarity to the potential developed in the output of device 21. The control electrode 22 of the device 21 is connected to ground through a resistor 27, and to a resistance network 23 through a resistor 29 and an adjustable potentiometer 28 of network 23. The control electrode 18 of device 19 is connected to network 23 through a resistor 30. Unidirectional biasing potential is applied to the control electrodes of devices 19 and 21 from source B+ through a resistor 31 and resistance network 23, as shown. The above described circuit forms a balancing arrangement for devices 19 and 21, and the potentiometer 28 is adjusted so that for zero output from discriminator 25 the anode potentials of devices 19 and 21 are of equal amplitude and opposite polarity.

The output of the direct current amplifier stage is taken across load resistors 32 and 33 which are connected respectively to the anodes 34 and 35 of devices 19 and 21. The potentials appearing across the load resistors 32 and 33 are applied respectively to the control electrodes 36 and 37 of two balanced control discharge devices 38 and 39 through resistors 40 and 41. The cathodes 42 and 43 of the devices 38 and 39 are connected together and further connected to ground through a resistor 44. The anodes 45 and 46 of the devices 38 and 39 are connected to a center-tapped coil 47 of a reversible tuning arrangement 48.

The tuning arrangement 48 comprises a motor 49, having armature terminals 168 and 169, which drives a shaft 50, this shaft passing through the coil 47 and carrying a pair of disks 51 and 52. The shaft 50 and the disks 51 and 52 are constructed of soft iron or similar material and become magnetized in a direction depending upon the resultant magnetic field of the coil 47. The direction of this resultant field and hence the magnetism of the shaft 50 and the disks 51 and 52 is dependent upon whether the anode current of the device 38 or the anode current of the device 39 predominates, and when these anode currents are equal the resultant magnetic field becomes zero. A further disk 53 of soft iron or similar material is connected by means of a swivel joint to a threaded shaft 54 in such a manner that rotation of the disk 53 rotates the shaft 54 and thereby controls the receiver tuning mechanism, shown in this example as permeability tuned coils 55 and 56. A permanent magnet 57 is placed beneath the disk 53, the magnet 57 having the form of a disk of substantially the same diameter as the disk 53, the magnetism of the magnet 57 being of greater strength than the magnetism of the shaft 50 and the disks 51 and 52. It can be seen therefore that for one direction of magnetism in the shaft 50 and the disks 51 and 52 the disk 53 will take a position shown by the solid lines and engage one disk 52, and hence by a friction drive the shaft 54 will be rotated and the tuning coils 55 and 56 will be tuned in one direction. When the direction of the magnetism in the shaft 50 and the disks 51 and 52 reverses, the disk 53 takes the position shown by the dotted lines and the direction of rotation of the shaft 54 is reversed. It is apparent that there is no rotation of the shaft 54 when the resultant magnetic field of the coil 47 is zero.

In the above described system a control circuit for a radio receiver is provided and when the receiver is tuned to a signal any deviation in the receiver from the center frequency of this signal gives rise to a control potential across the load resistors 9 and 10 of the frequency discriminator 5, the sign and amplitude of this control potential being dependent upon the direction and magnitude of the deviation. This control potential is amplified in the balanced direct current amplifier and applied to the balanced control devices 38 and 39, as previously described. Any unbalance in the output of the devices 38 and 39 caused by the control potential will drive the tuning mechanism 48 in such a direction as to restore the balance and hence retune the receiver to the center frequency of the received signal.

The system thus far described may be termed the automatic frequency control section of the search tuning system and the following description is directed to the means whereby the receiver is scanned through the frequency band and automatically tuned to a desired signal having a magnitude above a predetermined threshold.

The output of the discriminator 5 appearing across the load resistor 10 is applied to the control electrode 58 of a gaseous discharge device 59 through a resistor 60, the control electrode 58 being coupled to ground through a capacitor 61, capacitor 61 acting as a bypass for extraneous noise and other short duration impulses. In the absence of a desired signal, the device 59 is biased to a nonconductive state by means of a unidirectional potential from a source C— which is applied to the control electrode 58 by way of a potentiometer 62 and a resistor 63. The potentiometer 62 is variable and provides a threshold control for the device 59. The anode 64 of the device 59 is connected to the control electrode 65 of an electron discharge device 66 through a resistor 67 and to a contact 68 of a relay 69 through a resistor 70. The control electrode 65 of the device 66 is connected to a negative biasing source C— through a resistor 71. The cathode 72 of this device is grounded and the anode 73 is connected to the anode 34 of the device 19. A contact 74 of the relay 69 is connected to a source of unidirectional potential B+ and when the relay 69 is energized the contacts 68 and 74 close and unidirectional potential is applied to the anode 64 of the device 59 through a resistor 70. Further contacts 75 and 76 of relay 69 also close when the relay is energized to connect motor 49 to a source of motor potential.

When device 59 is non-conducting, the voltage on anode 64 is of such a value that it overcomes the negative bias on the control electrode 65 of the device 66 and drives this control electrode slightly positive which causes a current flow in the device 66, thereby unbalancing the control devices 38 and 39 and hence causing the receiver tuning mechanism to tune the receiver through the frequency band. This tuning continues until a signal having an amplitude sufficient to overcome the adjustable threshold on the gaseous discharge device 59 is intercepted. When such a signal is received, device 59 becomes conductive and the potential of anode 64 falls to such a value that the bias on the control electrode of device 66 returns this device to its nonconductive state and no longer exerts an unbalance on control devices 38 and 39. The previously described automatic frequency control then becomes operative accurately to control the receiving tuning mechanism for optimum reception of the incoming signal.

The relay 69 includes a coil 85 and one terminal of this coil is connected to a source of unidirectional potential B+ and to contact 79 of a push button 77. The other terminal of coil 85 is connected to the anode 86 of the discharge device 82, the cathode 87 of this device being connected to ground. The contact 80 of pushbutton 77 is connected to the control electrode 81 of device 82 through a resistor 83, electrode 81 being connected to a source of negative biasing potential C— through a resistor 84, which normally biases device 82 to a nonconductive state. A capacitor 78 is connected between contact 80 and ground for the purpose to be described.

The relay 69 is energized by means of a momentary depression of pushbutton 77. This momentary depression applies potential from the source B+ to capacitor 78 charging this capacitor. The charge on capacitor 78 positively biases the control electrode 81 and device 82 becomes conductive, thus completing to ground the circuit of coil 85 of the relay 69 and energizing this relay. Relay 69 remains energized until the charge on capacitor 78 leaks off through resistors 83 and 84 and when the charge has leaked off, device 32 returns to its nonconductive state. The time constant of the capacitor 78 and resistors 83 and 84 is made such that relay 69 remains energized for a time sufficient to allow the tuning circuit to select a signal and accurately tune the receiver to this signal.

The pushbutton 77 is provided with two normally closed contacts 88 and 89. These contacts are included in the cathode circuit of the gaseous discharge device 59. Therefore, although the device 59 may be conducting due to a received signal before pushbutton 77 is depressed, the depression of the pushbutton energizes the relay 85 and in the manner previously described tunes the receiver away from this received signal and the depression of the pushbutton also opens the cathode circuit of the device 59 which assures that the device 59 is completely deionized and prepared for the next signal as the pushbutton 77 returns to its normal position.

The tuning mechanism 48 includes a return switch 90 and when the mechanism is at the top of its travel an arm 91 moves a switch arm 92, closing a contact 93 and thus applying unidirectional potential from the source B+ through the control electrode 36 of the discharge device 38 through a resistor 94. This unbalances the control devices 38 and 39 and the tuning mechanism is returned to the bottom of its travel, the contact 93 remaining closed until the arm 91 coacts with the switch arm 95 to reopen this contact.

From the above description it is apparent that when pushbutton 77 is depressed for a moment and then released, relay 69 is energized for a predetermined period and motor 44 shifts the tuning mechanism away from the station presently being received. The gaseous discharge device 59 is deionized due to the fact that when the pushbutton 77 is depressed, the cathode circuit of this device is opened and when the pushbutton is returned to its normal position the motor 49 has shifted the tuning mechanism away from the station formerly received and the device 59 is in its non-conductive state. The receiver scans the frequency band, as previously described, until a signal of strength sufficient to overcome the bias on the device 59 is received and this restores the balance to the control devices 38 and 39, and the automatic frequency control tunes the receiver accurately to the received signals.

When the receiver has been tuned to the received signal, the charge on the capacitor 78 reaches a point where the device 82 again becomes nonconducting and the relay 69 becomes deenergized, and the search tuning circuit is switches to its standby state, the circuit remaining in this condition until the pushbutton 77 is again depressed and the above described sequence of events again initiated. When the search tuning circuit is in its standby state, the motor 49 is deenergized and anode potential is removed from the devices 19, 21, 59, 66, 38 and 39 and hence the system consumes substantially no power except when it is in actual operation.

Referring now to the modification shown in Fig. 2, wherein like numerals indicate elements similar to those shown in Fig. 1, I have again shown a conventional superheterodyne radio receiver comprising a radio frequency amplifier stage 1, a mixer stage 2, a local oscillator stage 3 and an intermediate frequency amplifier stage 4. The intermediate frequency amplifier stage 4 is coupled to a frequency discriminator 96 of the type utilizing a single multi-grid electron discharge device. The output of the intermediate frequency amplifier 4 is applied to the frequency discriminator 96 by way of a coupling circuit which includes an inductance 97 and a capacitor 98. The coupling circuit also includes a rectifying device 99, as shown, and amplitude modulation audio signals may be taken across the resistor 100 which is bypassed for intermediate frequencies by a capacitor 101. These audio signals may be applied to the contact 12 of a switch similar to switch 14 of Fig. 1 and thence to the audio output stages of the receiver.

The discriminator 96 comprises a discriminator transformer 102 having a primary winding 103 tuned by a capacitor 104 and a secondary winding 105 tuned by a capacitor 106. One side of the primary winding 103 is connected to the control electrode 107 of the electron discharge device 108 through a resistor 109, and one side of the secondary winding 105 is connected to a signal electrode 110 of the device 108 through a resistor 111, the signal electrode 110 being shielded by the screening electrodes 112 which are connected to a source of unidirectional potential B+ through a resistor 113 and bypassed by a capacitor 114. The cathode 115 of device 108 includes the usual cathode biasing resistor 116 which is bypassed by a capacitor 117 and the cathode is also positively biased from the unidirectional source B+ through a resistor 118. The anode 119 of device 108 is connected to the unidirectional potential source B+ through a resistor 120 and bypassed to ground by a capacitor 121. The discriminator transformer 102 is so tuned that when an intermediate frequency signal of a frequency lower than the frequency to which the discriminator transformer 102 is tuned, is received, the anode potential of device 108 increases above its normal value, and conversely, when an intermediate frequency signal higher in frequency than that to which the discriminator transformer 102 is tuned, is received, the anode potential of device 108 decreases below its normal value. Therefore, an audio output potential appears at the junction of anode 119 and resistor 120 in response to frequency modulation in the intermediate frequency signal. This audio output may be applied to contact 13 of a switch similar to switch 14 of Fig. 1. The resistors 109 and 111 are included in the control and screened electrode circuits as in their absence when an intermediate frequency signal reaches such a magnitude that these electrodes are driven positively, the discharge device 119 acts as a limiter and the audio signals appearing across the resistor 100 are distorted.

It is pointed out that as the tuning control of the receiver is advanced from the low frequency side of a signal to the high frequency side, the anode potential of device 108 first rises to a maximum peak and then falls to a minimum peak, passing through the normal potential between the peaks and returning again to the normal potential after the signal is completely passed. In the present search tuning system the receiver is tuned from the low frequency side to the high frequency side of a desired signal and the rise of anode potential of the device 108 to a maximum peak and the fall of this potential to the normal value at the center frequency of the signal is used to control the tuning of the receiver.

The output of frequency discriminator 96 is applied to the control electrode 122 of an electron discharge device 123 through a resistor 124 and a resistor 125, the control electrode being coupled to ground through a capacitor 140. The cathode 137 of the device 123 is positively biased by a potential derived across the potentiometer resistors 138 and 139 connected between the unidirectional source B+ and ground. The resistor 139 is variable and acts as a threshold control for the device 123. A neon tube 141 is included in the cathode circuit of the device 123 and acts as a source of reference potential and as an indicator tube, as this tube will glow more brightly when a signal is approached and the device 123 draws current. The anode 126 of the device 123 is connected to the unidirectional source B+ through a resistor 127 and a relay coil 128. The amount of current through the coil 128 may be adjusted by means of a variable resistor 142, as shown. One terminal of a relay coil 135 is connected to the junction of the resistor 127 and the coil 128 through series resistors 129 and 136. The other terminal of the coil 135 is connected to ground. One terminal of a pushbutton 130 is connected to the junction point of the resistors 129 and 136, and the other terminal of this pushbutton is connected to a contact 134 of the relay 128 and to a contact 131 of the relay 135. Further contacts 143 and 144 of the relay 128 are connected to a resistor 133, as shown, the contact 143 being grounded and the contact 144 being additionally connected to one terminal of a reversing switch 132. Contact 146 of relay 135 is connected to one terminal 160 of a source of motor potential. The other terminal 147 of the motor source potential is connected to ground. Contact 146 is also connected to terminal 163 on limit switch 150. The common switching contact 145 of relay 135 is connected to terminals 161, 162 of reversing switch 132 and contact 145 is also connected to terminal 164 on limit switch 150. The third contact 165 of reversing switch 132 is connected to common switching contact 144 of relay 128. The common switching contacts 166, 167 of reversing switch 132 are connected to supply energizing potential to the armature terminals 168, 169 of motor 49. The reversing switch 132 is connected to the tuning motor 49 which drives the tuning mechanism 48 through a gear box 148 and the threaded shaft 54. The tuning mechanism includes a switching device 149 which reverses the switch 132 at one end of the travel of the tuning mechanism 48, thus returning the tuning mechanism to the other end of its travel where the switching device 149 again reverses the switch 132.

When the receiver is switched on, current flows from the unidirectional source B+ through the relay coil 128, the resistor 129, the pushbutton 130, the contacts 131 and 145, the reversing switch 132, the motor 49 and the resistor 133 to ground, this current being sufficient to energize the relay coil 128 but insufficient to turn the motor 49. The relay coil 128 is therefore energized and the contacts 144 and 134 are closed which forms a holding circuit for the relay 128, through the resistor 129, the pushbutton 130, the closed contacts 134 and 144 and the resistor 133 to ground. Some current passes to the relay coil 135 through the resistors 129 and 136 but this current is insufficient to actuate the relay 135.

When the pushbutton 130 is depressed the holding circuit of the relay 128 is broken and this relay becomes deenergized, and the resistor 133 is short-circuited by the now closed contacts 143 and 144. Current is diverted to the relay 135 through the resistors 129 and 136, the variable resistor 142 being adjusted to such a value that the relay 128 is not actuated under this condition. The relay 135 is therefore energized and closes the contacts 145 and 146 energizing the motor 49, and the tuning mechanism tunes across the frequency band. When a signal is approached, as previously described, there is a rise of anode potential of the device 108. If this potential rise is sufficient to overcome the threshold established by the resistor 139, the device 123 becomes conductive. The relay coils 128 and 135 are each included in the circuit of the device 123 and when this device conducts, coil 128 becomes energized, closing the contacts 144 and 134, thus inserting the resistor 133 in the circuit of the tuning motor 49 and the motor operates at a reduced speed, the coil 135 remaining in its already energized state. As previously described, the control potential applied to the control electrode 122 of the device 123 rises to a maximum peak and thence returns to normal as the receiver is tuned from the low frequency side of the signal to the center frequency. The relays 128 and 135 are therefore energized for this period and when the center frequency is reached and the control potential returns to normal, the device 123 returns to its non-conductive state and the relays 128 and 135 simultaneously become deenergized, the contacts 134 and 143, 145 and 131 close and a short circuit is therefore placed across the armature of the motor 49 which acts as a dynamic brake and the motor promptly stops at the center frequency of the desired signal.

The neon tube 141 glows and when a signal is approached and the glow becomes brighter as the control potential rises to a maximum peak and gradually fades as the center frequency of the signal is approached.

The tuning mechanism 48 is equipped with a switching device 149, as previously described, which causes the motor 49 to reverse when the tuning mechanism reaches the end of its travel. When the tuning mechanism 48 reaches the high frequency end of the frequency band the switching device 149 also closes a switch 151, connecting the control electrode 122 of the device 123 to ground and making this device unresponsive to received signals. The switch 150 is also closed at this point and the motor 49 is directly energized and the tuning mechanism is returned to the low frequency end of the frequency band where the switch 132 is again reversed, switches 150 and 151 are opened and the receiver is once more conditioned to scan the frequency band and to be automatically tuned to a received signal. The control line 152 can also be connected to the usual audio muting means to eliminate unnecessary noise in the receiver as the tuning mechanism 48 is being returned to the low frequency end of its travel.

The search tuning system described above obviates the necessity of pretuned circuits or preset mechanical means to effect the tuning of a radio receiver. This system moreover causes the receiver circuits to scan the frequency band until a signal of desired strength is received and automatically tuned to this signal.

While certain specific embodiments have been shown and described, it will of course be understood that various modifications may be made without departing from the invention. The appended claims are therefore intended to cover any such modifications within the true spirit and scope of the invention.

What I claim as new and desire to secure by Letters Patent of the United States is:

1. In a radio receiver, the combination of a frequency discriminator, a plurality of balanced electron discharge control devices, a tuning mechanism for the receiver, means controlled by said control devices for moving said tuning mechanism, means for unbalancing said control devices thereby to cause said tuning mechanism to tune the receiver through a band of frequencies in a predetermined direction, means for deriving a control potential from said frequency discriminator in response to a signal intercepted by said receiver and means utilizing said control potential for disabling said unbalancing means thereby to arrest the motion of said tuning mechanism.

2. An automatic tuning control for a radio receiver comprising a frequency discriminator, a pair of balanced electron discharge control devices and a tuning mechanism for the receiver, means controlled by said control devices for moving said tuning mechanism, means for unbalancing said control devices causing said controlled tuning mechanism to tune the receiver through a band of frequencies in a predetermined direction, means for deriving a first control potential from said frequency discriminator in response to a signal intercepted by said receiver, means utilizing said first control potential for disabling said unbalancing means thereby to arrest the motion of said controlled tuning mechanism, means for deriving a second control potential from said frequency discriminator, and means for impressing said second control voltage on said control devices, thereby controlling the motion of said controlled tuning mechanism for accurately tuning said receiver to said intercepted signal.

3. In a radio receiver, the combination of a plurality of balanced electron discharge control devices, a movable tuning mechanism for the receiver, means controlled by said control devices for moving said tuning mechanism, means for unbalancing said control device thereby to cause said tuning mechanism to tune the receiver through a band of frequencies in a predetermined direction, means including adjustable threshold means for deriving a control potential in response to a signal intercepted by said receiver when said intercepted signal has an amplitude greater than said adjustable threshold, and means utilizing said control potential to disable said unbalancing means thereby to arrest the motion of said tuning mechanism.

4. In a radio receiver, the combination of a frequency discriminator, a plurality of balanced electron discharge control devices, a movable tuning mechanism for the receiver, means controlled by said control devices for moving said tuning mechanism, means for unbalancing said control devices to cause said tuning mechanism to tune the receiver through a band of frequencies in a predetermined direction, means responsive to a signal intercepted by said receiver for deriving a control potential, means utilizing said control potential to disable said unbalancing means, means for deriving an automatic frequency control potential from said discriminator in response to said intercepted signal, means for impressing said automatic frequency control potential on said control devices in a balanced state for accurately tuning the receiver to said intercepted signal.

5. In a radio receiver, an automatic tuning control comprising, movable tuning means for tuning said receiver through a band of frequencies, frequency discriminating means, means for deriving an automatic frequency control potential from said frequency discriminating means in response to signals intercepted by said receiver, control means for moving said movable tuning means, means for applying said automatic frequency control potential to said control means to cause said tuning means accurately to center on a first intercepted signal, means for applying a searching potential to said control means to cause said tuning means to move in a predetermined direction in search of a second signal within said frequency band, means for deriving a second control potential from said frequency discriminating means in response to a second signal intercepted by said receiver, and means responsive to said second control potential for disabling said searching potential applying means, whereby said automatic frequency control potential causes said tuning means accurately to center on said second signal.

6. In a radio receiver, an automatic tuning control comprising, movable tuning means for tuning said receiver through a band of frequencies, frequency discriminating means, means for deriving an automatic frequency control potential from said frequency discriminating means in response to signals intercepted by said receiver, control means for moving said movable tuning means, means for applying said automatic frequency control potential to said control means to cause said tuning means accurately to center on a first intercepted signal, means for applying a searching potential to said control means to cause said tuning means to move in a predetermined direction in search of a second signal within said frequency band, means for deriving a second control potential from said frequency discriminating means in response to a second signal intercepted by said receiver, means responsive to said second control potential for disabling said searching potential applying means, whereby said automatic frequency control potential causes said tuning means accurately to center on said second signal, and means for applying a third control potential to said control means to cause said tuning means to traverse said frequency band in the opposite direction without interruption from signals intercepted by said receiver.

7. In a radio receiver, the combination of a frequency discriminator, a plurality of balanced electron discharge control devices, a movable tuning mechanism for the receiver, means controlled by said control devices for moving said tuning mechanism, means for connecting the output of said discriminator to said control devices thereby accurately to tune said receiver to a received signal, means for supplying an unbalancing search potential to said control devices to cause said tuning mechanism to tune the receiver through a band of frequencies in a predetermined direction, means responsive to a signal intercepted by said receiver for developing from said frequency discriminator a control potential, and means including adjustable threshold means for disabling said search potential applying means when said control potential has an amplitude greater than said adjustable threshold, whereby said frequency discriminator causes said receiver accurately to tune to said intercepted signal.

8. In a radio receiver, the combination of a frequency discriminator, a plurality of balanced electron discharge control devices, a tuning mechanism for the receiver, means controlled by said control devices for moving said tuning mechanism, means for connecting the output of said discriminator to said control devices thereby accurately to tune said receiver to a received signal, means for unbalancing said control devices to cause said tuning mechanism to tune the receiver through a band of frequencies in a predetermined direction, means responsive to a signal intercepted by said receiver for developing from said frequency discriminator a control potential, means including adjustable threshold means for disabling said unbalancing means when said control potential has an amplitude greater than said adjustable threshold, whereby said discriminator causes said receiver accurately to tune to said intercepted signal, and means for unbalancing said control devices when the limit of said frequency band is reached to cause said tuning mechanism to traverse said frequency band in the oposite direction without interruption from signals intercepted by said receiver.

9. In a radio receiver of the type having a frequency discriminator, an automatic tuning control system comprising, a plurality of balanced electron discharge control devices, a tuning mechanism for the receiver, means controlled by said control devices for moving said tuning mechanism, means for connecting the output of said discriminator to said control devices thereby accurately to tune said receiver to a received signal, means for supplying an unbalancing search potential to said control devices to cause said tuning mechanism to tune the receiver through a band of frequencies in a predetermined direction, means responsive to a signal intercepted by said receiver for developing from said frequency discriminator a control potential, means including adjustable threshold means for disabling said search potential applying means when said control potential has an amplitude greater than said adjustable threshold, whereby said discriminator causes said receiver accurately to tune to said intercepted signal, time delay means initiated by said search potential applying means, and means controlled by said time delay means for disabling said automatic tuning control system.

10. In a radio receiver of the type having a frequency discriminator, an automatic tuning control system comprising, a plurality of balanced electron discharge control devices, a tuning mechanism for the receiver, means controlled by said control devices for moving said tuning mechanism, means for connecting the output of said discriminator to said control devices thereby accurately to tune said receiver to a received signal, means for unbalancing said control devices to cause said tuning mechanism to tune the receiver through a band of frequencies in a predetermined direction, means responsive to a signal intercepted by said receiver for developing from said frequency discriminator a control potential, means including adjustable threshold means for disabling said unbalancing means when said control potential has an amplitude greater than said adjustable threshold, whereby said discriminator causes said receiver accurately to tune to said intercepted signal, means for unbalancing said control devices when the limit of said frequency band is reached to cause said tuning mechanism to traverse said frequency band in the opposite direction without interruption from signals intercepted by said receiver, time delay means initiated by said first mentioned unbalancing means, and means controlled by said time delay means for disabling said automatic tuning control system.

ALFRED F. BISCHOFF.

REFERENCES CITED

The following references are of record in the file of this patent:

UNITED STATES PATENTS

| Number | Name | Date |
|---|---|---|
| 2,056,200 | Lowell | Oct. 6, 1936 |
| 2,369,542 | Dietrich | Feb. 13, 1945 |
| 2,375,133 | Polkinghorn | May 1, 1945 |